(12) United States Patent
Pleasant et al.

(10) Patent No.: US 7,171,324 B1
(45) Date of Patent: Jan. 30, 2007

(54) SYSTEM AND METHOD FOR REMOVING MEASUREMENT ERRORS FROM MEASUREMENT SYSTEMS

(75) Inventors: Daniel L. Pleasant, Santa Rosa, CA (US); Gopalakrishnan Kailasam, Santa Rosa, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 11/251,426

(22) Filed: Oct. 14, 2005

(51) Int. Cl.
*G01R 31/00* (2006.01)
*G01R 31/28* (2006.01)

(52) U.S. Cl. .................. 702/117; 324/76.28; 324/601; 702/85; 702/107

(58) Field of Classification Search ............... 702/69, 702/85, 90, 107, 117, 124, 57, 59, 60; 324/76.28, 324/601, 638; 375/316; 455/67.14
See application file for complete search history.

(56) References Cited

U.S. PATENT DOCUMENTS

| | | | |
|---|---|---|---|
| 6,842,608 B2 | 1/2005 | Cutler | |
| 6,940,922 B2 | 9/2005 | Cutler | |
| 6,989,663 B2 * | 1/2006 | Nagle | 324/76.28 |
| 7,054,776 B2 * | 5/2006 | Bradley et al. | 702/107 |
| 7,054,780 B2 * | 5/2006 | Dunsmore et al. | 702/117 |

OTHER PUBLICATIONS

Pending U.S. Appl. No. 11/127,961, "Topology-Independent Calibration System," filed May 12, 2005.

* cited by examiner

*Primary Examiner*—Bryan Bui
*Assistant Examiner*—John Le

(57) ABSTRACT

A test system and method which utilizes a component data base that stores performance data for individual component of the system. The system and method can further provide for using data and information from one calibration procedure in connection with performing further calibration procedures. The system and method can further provide for utilizing data of from linear components of the system to determine performance characteristics of non-linear components.

22 Claims, 4 Drawing Sheets

SYSTEM AND METHOD FOR REMOVING MEASUREMENT ERRORS FROM MEASUREMENT SYSTEMS

BACKGROUND

Test measurement systems frequently provide for calibration procedures to account for the fact that such systems generally suffer from some degree of signal degradation. For example, measurement instruments do not always have flat frequency responses; cables used to connect different elements in a measurement system are not lossless, switches and filters will typically introduce some frequency dependent losses, and amplifiers can also add some nonlinearities if operated over an extended frequency range. Thus, to obtain accurate measurements it is necessary to measure the performance of the system and to mathematically account for the system performance in the measurement data. This process is sometimes referred to as calibration, or error correction, or alignment.

In many instances fixed configuration measurement systems are used to measure devices. The devices being tested are generally referred to as devices under test (DUTs). These fixed configuration measurement systems are sometimes implemented within an instrument box, and a DUT can be connected to ports of the fixed measurement system. In such systems a signal source in the instrument box will transmit a signal through various components also secured in the instrument box, and then this signal will be applied to the DUT. The measurement signals are then received by a receiver module, also secured in the instrument box, after the signal from the source has been reflected off of, or transmitted through, the DUT.

In some respects calibration of a fixed measurement system is a relatively standard operation, as the basic configuration of the components of the measurement system is fixed. In other situations, variable, or configurable measurement systems, which are often synthetic measurement systems, where different system components can be easily interchanged in the system and different system components are generally separately packaged and can be connected via cables and potentially other connecting devices, are used. Various specific test configuration set ups of such systems are sometimes referred to as test program sets (TPSs). In such configurable test systems, various system components are coupled together as a measurement test system and the operation of the various components of the systems are controlled by a controller, or an external processor which is coupled to components of the system. In some cases, software tools are provided which can be used to aid in programming the processor to control the operation of the various components in a given system to provide for desired measurements. In the past, the programming of the processor also provided for specific calibration procedures which were unique for each of the various combinations of components of the system, and the calibration process was generally included as part of test sequence which was used for a specific configuration.

For instance, a test program might instruct the operator of configurable system disconnect a cable from a DUT and to connect the cable to a different test port of the configurable system so that the performance characteristics of the system without the DUT can be measured, and then when the DUT is connected to the system, the loss of the cables, and other specific system operational characteristics could be mathematically removed from the final measurement data.

This calibration process for configurable systems has in the past been largely application specific, and requires particular steps in the test program. A different test program will usually require different calibration sequences, even if the same hardware components are being used. Further, the calibration sequences assume specific hardware configurations. If the test system is changed, or even if one component of the system is swapped out for another similar component, the calibration procedures will generally need to be reexecuted. Many past calibration procedures include multiple steps, where each step provides a particular type of performance information, which is not utilized by other steps in the calibration process.

DETAILED DESCRIPTION

Configurable instrument systems can allow for a high degree of flexibility, but generally speaking there is no single set of equations that can be written to take care of path corrections for any arbitrary system configuration. Thus, in some instances a general-purpose, topology-agnostic path correction service, or calibration, could provide advantages over prior approaches.

A system and method herein utilize a wide range of modeling techniques and path corrections techniques to provide for effective and efficient calibration of arbitrary and variable system topologies. One embodiment herein provides for a standard calibration service, or process, which can be used across a wide range of different system configurations. In fact, one embodiment herein could provide for a calibration service module which includes a set of calibration tools, and a calibration component database that together provide functionality that allows for a substantial decrease in the complexity of setting up new configurations in a configurable instrument system. This calibration service module can be accessed and used by a wide range of different test programs.

In one embodiment a database structure is used that allows the various calibration procedures to interact with each other and store common data. This allows standard procedures to be created that utilize several different calibration procedures with centralized storage and control facilities. By providing a standard calibration service module the test programs can be developed without needing to develop separate calibration procedures and the test program can simply access and utilize necessary tools from the calibration service module for obtaining measurement correction data and services. The calibration service module can also make it possible for the various calibration steps to utilize data from different calibration processes, which can enhance accuracy and ease the complexity of system calibration. For instance, if a cable can be calibrated by one technique, then the cable's effects can be removed from the next calibration, so the performance of other components of the system can be identified apart from the performance of the cable.

Different industry working groups, and organizations, are presently trying to develop standard language and schemes for specifying the topology of configurable measurement systems. For example, the ATML group (automatic test markup language) is developing an XML (extended markup language) schema that can be used to specify the topology of a test system, including components such as connectors, cables, signal sources, upconverters, and down converters. Such a general and universal programming approach could easily be incorporated into the calibration schemes disclosed herein.

Figure 1:
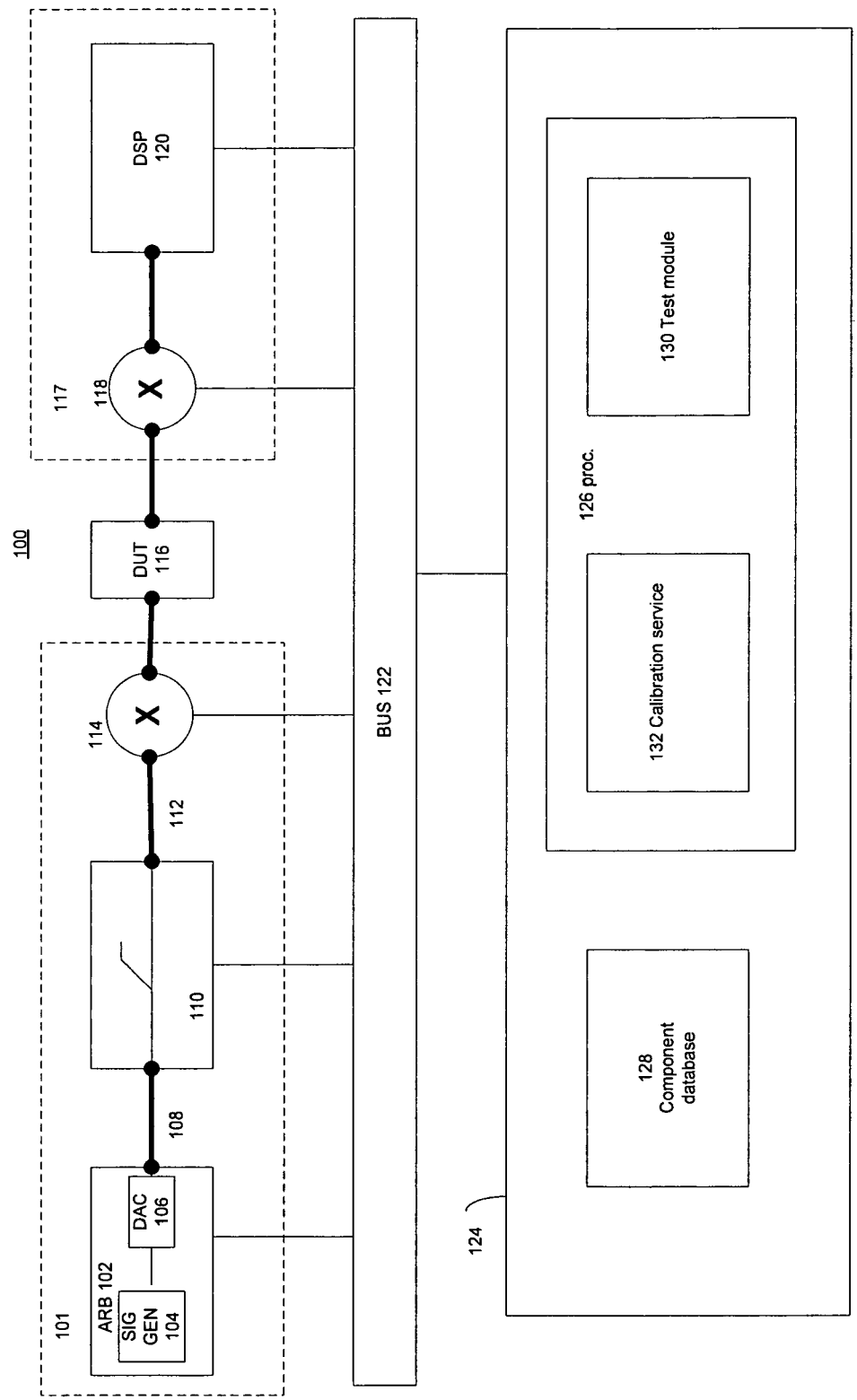
FIG. 1 is a block diagram illustrating an embodiment of a system of the invention.

FIG. 1 shows an embodiment of a system 100 herein. The system 100 includes a source module 101 and a receiver module 117. As shown the source module 101 includes a number of different components, but the specific components of the source module can vary for different implements of the configurable measurement system. It is noted that the source module 101 is shown as having a dashed line, which in this context is generally meant to illustrate that the elements of the source module are operating in conjunction with each other to provide of the function of a signal source, but the components in the source module are not necessarily secured within a single instrument box. Indeed the various components of the source module can be coupled together in a relatively flexible and adaptable manner using various cables and connectors.

The general operation of the source module 101 is to apply a test signal to a DUT 116. The system also includes a receiver module 117. The receiver module 117 can include a variety of different components, but its general operation is to receive a measurement signal which is either transmitted through, or reflected off of, the DUT 116. The system 100 also includes a communication bus 122, and a test system controller 124. The system controller 124 can be implemented in a variety of different ways. One common test system controller 124 is a general purposes computer, which has a non volatile memory such as hard drive, a user interface, such as a key board, mouse, and a display, and printer. The computer can also include a number of other elements as is known in the art. The computer will include a processor 126, which could be a general purpose processor which is programmed to provide a test module 130 which is to control operation, and testing procedures of test system. The test module 130 can control the operation of various components of the measurement system, and provide a user interface which will prompt a user of the system to take certain actions in connection with the operation of the system. Additionally, the processor 126 will be programmed to implement the various processes of a calibration service module 132. The calibration service module 132 can also provide instructions to a user of the system in connection with the calibration operations of the system.

Additionally, as will be discussed in more detail below the calibration operations of the system will operate to obtain and utilize a range of different types of operational data for the various components of the test system. Thus, a component database 128 can also be included with the test system controller 124, or the database could reside on a storage device external the system controller 124. The component database 128 can include an identification field for each component used in the system 100, and each component used in the system can be provided with an identification tag. The component database 128 can also include extensive data regarding each of the components, but in one embodiment, at a minimum it will include performance characteristics for the component stored in the database. One potential advantage to providing a component database which resides on a storage device external to the system controller, for example providing the component database on a central server, is that the data can then easily be shared by a number of different test systems. System components are sometimes swapped between one system and another system. In such situations the data obtained for a component in one system could then be used by another system which has access to the component database on the central server.

In the context of the discussion herein it is helpful to consider what is meant by the term calibration. As used herein calibration generally refers to the process of measuring characteristics of a system, or components of a system, and then subsequently using these characteristics to correct measurement data, so that actual determinations made regarding characteristics of a device being tested take into account the operational characteristics of the test system itself. This type of calibration is generally somewhat different than an "instrument calibration" procedure where periodic instrument calibrations, and adjustments, of a system are is done to insure measurements made by a particular measurement systems area traceable to NIST (National Institute of Standards and Technology).

The communication bus 122 of the system 100 provides for a communication channel through which information can be transmitted from the various components of the system to the controller 124. It should also be noted that the digital signal processing module (DSP) 120 which is shown as part of the receiver module 117 could also include a processor which could be programmed to provide the functions of the system controller 124. Indeed the processing module described herein could be implemented in various distributed processing systems, or could be largely contained in one single system controller as shown in system 100.

In configurable instrument systems, since the system topology can vary, some mechanism is needed that gives test programmers the ability to perform path calculations by specifying the signal path in use. A number of different S-parameter simulators have been developed and are widely available, and such simulators allow a programmer to specify a given test signal path. In a system where there is a component database with S-parameters for various linear components of a test system configuration, and a netlist (i.e., system topology, which specifies which linear components are used in a given test system configuration), an S-parameter simulator can be used to de-embed path characteristics from a given measurement data set.

Figure 2:
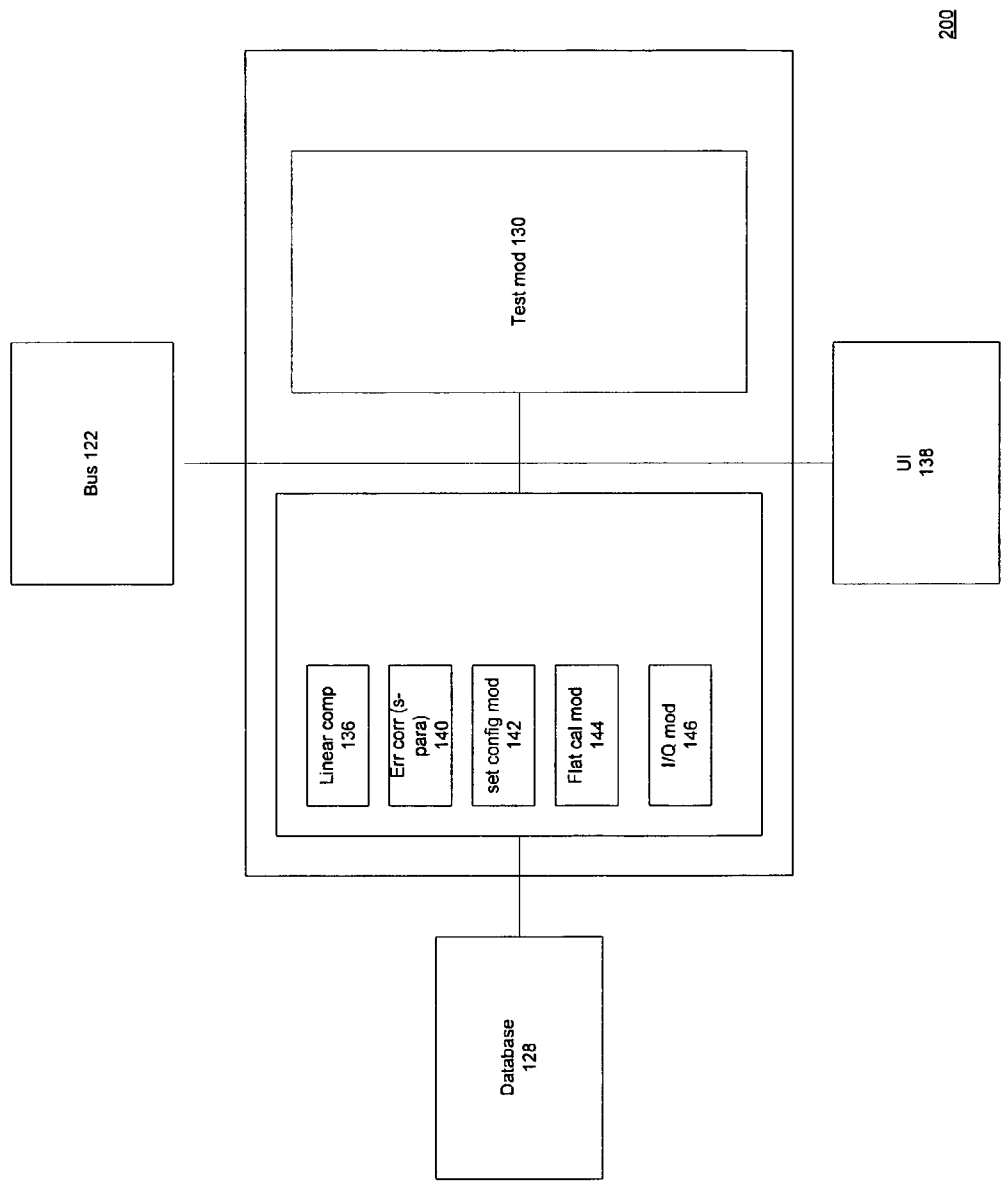
FIG. 2 is a block diagram illustrating an additional embodiment of a system of the invention.

FIG. 2 is a block diagram showing additional elements of an embodiment of a system of the present invention. The system 200 illustrates additional modules which can be included within the calibration service module 132, and illustrates aspects of the relationship between the calibration service module and other elements of the system 200. In FIG. 2, a communication bus 122 is provided which communicates information between other elements of the test system and the processor 126 of the controller. The calibration service module 132 contains various modules which provide for calibration operations. The calibration services module 132 interfaces with the test module 130, and can provide services for the test module, and can exchange data with the test module. Additional operations of different modules of the calibration services are described below.

In one embodiment of a system herein a linear component module 136 is provided. The linear component module operates to obtain and store operational parameters or characteristics of various linear components which can be used in the configurable measurement system. These linear components would typically include cables, connectors, etc. In some cases a library of components, where the components have generally predictable and repeatable S-parameter characteristics (e.g., standard adapters and connectors) can be developed, and utilized such that, for some test system applications, it will not be necessary to physically measure each component in the system. For other components, such as cables it will be preferable to measure the actual component itself to determine the corresponding S-parameters. The information can come through the bus 122, or it can be provided through a user interface 138. In some circumstances the system can allow for measuring combinations of individual components (e.g. entire signal paths can be measured and the results stored as though the path is a single component).

The operational parameter data in a database can later be accessed by an error correction module. One widely available device for measuring operation parameters, such as S-parameters, of components used in measurement systems is a network analyzer. In less complicated and lower accuracy configurable measurement systems a simple end-to-end path loss measurement of a given component can be made using a power meter. In one embodiment the performance data is stored in a component database 128 which correlates the operational data with an identification tag for the given component. In one embodiment the data in the component database can be stored in an ATML-compatible (i.e., XML) data file.

In one embodiment the calibration service module 132 will include a set configuration module 142, which allows a user to input the configuration of the test system (including an identification of the components used in the configurable test system). In addition, or alternatively the calibration set configuration module 142, could access a file describing the topology of the test system from the test module 130. The calibration set configuration module can also operate to identify the measurement reference plane in the configurable test system. In one embodiment the topology can be specified as an ATML-compatible data file. An embodiment herein can provide path corrections that de-embed measurements to the desired measurement reference plane.

In embodiments where an S-parameter simulator, or other error correction, type module 140 is included with the calibration service module 132 to provide for path corrections, the functionality of the simulator can be extended to also provide for measurement uncertainty information. For applications where measurement uncertainty information is desired the operational characteristic data stored in the component database should include uncertainty information for the component data. A Monte Carlo simulation can then be run to obtain measurement uncertainties.

In many situations system calibrations are performed at the beginning of a test series or after the test system has been relocated. In addition to providing data to shift the measurement reference plane, such calibrations are also is good for identifying damaged components, or bad connections, and missing connections, in the test system. Additionally, by storing historical calibration data in the component database, the calibration service module 132 can track changes to the test system and the components over time, allowing operators to diagnose failures or even predict them.

In some circumstance it can be assumed that the output power of a source module 101 has been calibrated (via instrument calibration cycle). However, losses between the output of the source module 101 and the input of the DUT 116 are often high enough that the source output must be increased to compensate. For example, in the system 100, there would be losses in the cable 115 which connects the output of the upconverter 114 to the in input of the DUT 116. If the system has been characterized and the topology is known, the S-parameter simulator can be used to calculate the power that will be delivered to the input of the DUT 116, where the simulator would access the S-parameter data of for the cable 115 in the component database 128. This allows the input power to be accurately determined (within the uncertainty of the source) without the use of a power meter, even for broadband signals. For higher accuracy (e.g., better than the ~1 dB power level accuracy of the source), a power meter could be used to detect the actual power output from the cable 115.

In addition to the component database 128 which stores operational performance data for components of the system, some of the components can also include a memory element which stores operational performance data for the given component. For example, the system 100 provides for a switch 110 between the ARB signal generator 102 and the upconverter 114. The operational characteristics of the switch could be tested by the switch manufacturer, and stored in a nonvolatile memory of the switch and made available to the calibration service module 132 through the communication bus 122. This switch operation performance data could be, for example, measured S-parameters, which can be full N-port S-parameters, including crosstalk terms. A simple API can be made available that allows the data to be transmitted to the calibration service module and stored in the component database 128. This would simplify system configuration and maintenance because the switches would not have to be re-characterized when a switch box is replaced in the configurable test system 100.

It is worth noting that S-parameter simulators are widely used in the test and measurement field. The simulators are frequently implemented by general purpose processors programmed to perform as a simulator, which determines or calculates expected performance for a device or system based on the S-parameters for the components in the system. Further, where the performance of a module of the system is known, and S-parameters are known for some devices in the module, calculations can be made to determine the characteristics of other components in the system.

In measurement systems where the system is provided in a preconfigured and generally fixed assembly, flatness corrections can be done internally without needing to accommodate a range different possible configurations or combinations of components. A flatness calculation is generally a calibration which is implemented to correct for the changing frequency response of different components of a measurement system. The measurement system, for example system 100, of FIG. 1, could include an arbitrary signal generator 102, an upconverter 114, a down converter 118, and in digital systems a analog-to-digital converter (ADC) can be included as part of a digital signal processor (DSP) 120, and the interaction between these nonlinear types components, as well as other more passive or linear components of the system, such as cables, connectors, and in some applications, amplifiers, can cause the performance, or gain of the measurement system to vary with frequency. In general terms, a linear component is one which has fairly stable performance over the frequency range of operation, and nonlinear component is one which has variable performance over the frequency range in question.

In an embodiment herein, since the various different components of the measurement system are no longer contained in single box, or in a predetermined configuration, it is advantageous for the flatness calibration to be handled in an adaptable manner, meaning that the flatness calibration can account for the fact that various different unique components are included in the measurement system. Additionally, in a configurable system, components of the system can sometimes be removed and replaced with a second component which could have similar or very different performance characteristics, and systems herein can in some cases accommodate changing of components without requiring new calibrations.

There a number of different calibration techniques that can be used for flatness calibration. Some widely used flatness calibration techniques are described in U.S. Pat. No. 6,842,608 and U.S. Pat. No. 6,940,922, and both of these patents are incorporated by reference herein in their entirety. These flatness calibrations basically use a set of frequency comb waveform measurements, and frequency shifting, to derive the frequency characteristics of both the source and receiver modules of the measurement system.

One aspect of some flatness calibration techniques is that the calibration can require a significant amount of time, in the 10's of seconds to complete the calibration. For calibrations that are done infrequently this is not a problem. However, in some applications calibrations must be done much more frequently. This is particularly true if the system components include a YIG-tuned filter (YTF); such filters tend to drift with time, temperature, center frequency, and tuning history. For these types of systems, faster calibration techniques can be very beneficial.

Another type of a flatness calibration technique uses a "golden source" calibration, to provide for a faster calibration process. A golden source type of calibration assumes the existence of a comb waveform that is more accurate than the desired calibration requires. In configurable instrument systems, the combination of an arbitrary signal generator (ARB) 102 and an upconverter 114 can be calibrated using frequency shifting type calibration and then used as a golden source. Later, when the YTF in the receiver module has been tuned, the "golden source" can be used to send a known waveform through the receiver to achieve a fast and accurate calibration of the receiver module.

The implementation of flatness calibration using frequency shifting techniques generally requires measurements be made at runtime. In addition, a golden source type calibration can be made available to handle YIG-based circuits. Since the system topology and runtime environment cannot be predicted, these flatness calibration operations can be defined in a flatness calibration module 144 in the calibration service module 132, or alternatively the flatness calibration module might be included in the test module 130. However, in an embodiment herein, it could be advantages to provide the flatness calibration module in the calibration service module 132, so that it would be accessible to for use with different test configurations and test modules, which could utilize different aspects of the flatness calibration module as necessary for a given test system. Since the system configuration is flexible and could include a range of different possible system components, the flatness calibration module should include generic instrument, and component drivers, for controlling different components of the system, which are driven to implement the flatness calibration. For example, the IVI drivers which are widely used to control the operation of various, instruments, sources, and receivers can be utilized by the flatness calibration module.

In one embodiment of a calibration service module herein a flatness calibration module is provided which operates to instruct an operator of the system, through a user interface, such as display of the system controller 124, to configure the system 100 so that an ARB 102, upconverter 114, down converter 118 and DSP 120 are connected in series. (Note: the software can automatically configure such series connections where the system includes an appropriately configured switch box.) Any connecting cables or switches used in the series connection could be characterized in advance so their effects could be accounted for in the flatness calibration.

Once the flatness calibration module 144 has received an indication that the system has been configured as required for the flatness calibration, the drivers of the calibration service module would then drive the source module 101 and the receive module 117 so as to perform the necessary operations to perform the flatness calibration.

The calibration service module 132 would operate to add the flatness performance data to the component database 128. This flatness calibration provides flatness calibration data for the source module, and provides flatness calibration data for the receiver module. The S-parameter simulator module 140 can then use the flatness characteristic data of the of the source module 101, and the performance characteristics of the linear components of the source module, such as cables 108, and 112, and the performance characteristics of the switch 110, to determine the operational characteristics of the non-linear components of the source module, such as, for example, the upconverter 114. The characteristics of the non-linear components would then be stored in the component database 128 along with an identifying field for the non-linear component. Thus, in this manner the operational characteristics of the non-linear components could be identified by using the S-parameter simulator to de-embed the performance characteristics of the non-linear components. In a similar manner the non-linear component performance characteristics of the components in the receiver module could be identified, and stored in the component database 128. When a YIG-based component is a part of the configurable measurement system, the above operations can be repeated using golden source calibration techniques which could be defined in the flatness calibration module.

The calibration processes implemented by the modules of the calibration service module 132 should be designed to be as fast and unobtrusive as possible. In some circumstances it will be necessary to run these calibration procedures often. This will be particularly true when a YIG filter is used in the system. In a frequency-sweeping application it may be necessary to re-calibrate the system at each frequency step. This creates a requirement for the calibration procedure to be as fast and automatic as possible.

Another aspect of calibrating a system is dealing with the in-phase quadrature (I/Q) characteristics of the system. Many digital systems use an I/Q modulation scheme which is basically a digital modulation scheme, where a sine wave and a cosine wave are combined in a source module of the system, and then when the signal is received the two different components can be separated; thus, allowing for two signals in the same bandwidth. In such a system it is important that the combined signals have the same amplitude, that there is no DC offset, and that there is no unintended phase offset. The I/Q calibration takes such unintended amplitude or phase offsets into account.

There are three main aspects to calibration of I/Q signals: gain, quadrature, and offset. Once characterized, the usual approach to correction for these errors is to pre-distort an input signal to the signal generator 104 to correct for distortions that occur in the system. The signal generator 104 in one embodiment generates a digital signal and DAC 106 is provided which converts the digital signal to an analog signal. The signal from the DAC 106 is then up converted to a higher frequency by the upconverter 114. For low-bandwidth signals this can be accomplished in real time, but for high-bandwidth signals it can sometimes be necessary to predistort the signal before it is loaded into the ARB 102.

In general, it is advantageous calibrate I/Q signals on a case-by-case basis. A desired waveform is loaded into the ARB 102 and to the output of the ARB is upconverted. Any errors in the upconverted signal are measured and characterized, and then in the future the input signal can be predistorted to account for the errors. This predistortion can be very helpful where wide variations in signal waveforms can highlight nonlinearities in the transmission path.

In many applications once characterized, I/Q errors can be fairly stable, and the system does not need to be frequently recalibrated. Predistorted waveforms can be stored in the component database and re-loaded for later use. However, the length of time over which this type of calibration remains stable can vary. Thus, depending on the given application and the desired performance the I/Q errors will need to be recharacterized. The calibration service module can include an I/Q module 146 which operates to provide the functions for I/Q calibrations.

In a number of applications for different systems there can be hundreds, if not thousands, of different waveforms in use. It can become very time consuming and expensive to characterize and predistort all of them. Further, many of the waveforms do not require extremely high levels of signal purity. For this reason, a general purpose characterization mode of the calibration I/Q predistortion module 146 can operate to apply general distortion correction rules to any waveform, and where higher signal purity is needed a specific I/Q calibration can be used.

In one embodiment the I/Q predistortion module 146 will operate to provide two different modes of operation. In a high accuracy mode, a waveform-specific calibration is performed. In the second mode, for low accuracy and greater generality, the general characteristics of the transmission path can be measured. In this mode the I/Q distortion module can use a generic waveform that is designed to exercise the signal path but not overly stress it. This mode of the I/Q module 146 will provide for measuring the I/Q offset, gain balance and quadrature balance by generating simple signals in the ARB 102 and measuring the output with a spectrum analyzer (or down converter/digitizer pair). The resulting path characterization can then be used for other waveforms. In either mode the I/Q module 146 will provide a means to predistort the ARB waveform based on the measured system calibration data.

The I/Q predistortion module can utilize generic drivers, such as IVI drivers as discussed above to drive different components of the system such as the ARB 102. Additionally, the I/Q module can instruct the user of the system to make connections with other test measurement devices to measure the distortion in the signal path for a given signal input to the ARB 102. Based on the measured distortions, the I/Q predistortion module can then calculate pre-distortion coefficients and store them in the component database 128. In the high precision I/Q calibration mode a user of the system can supply specific waveforms which are used to the drive the ARB 102, and in the lower precision mode the I/Q predistortion module can apply one or more generic waveforms.

Many of the calibration operations described herein are interdependent and have some shared requirements, and can utilize some of the same data. Thus, providing a calibration service module which utilizes a common database and can share common instrument drivers can be advantageous.

Figure 3:
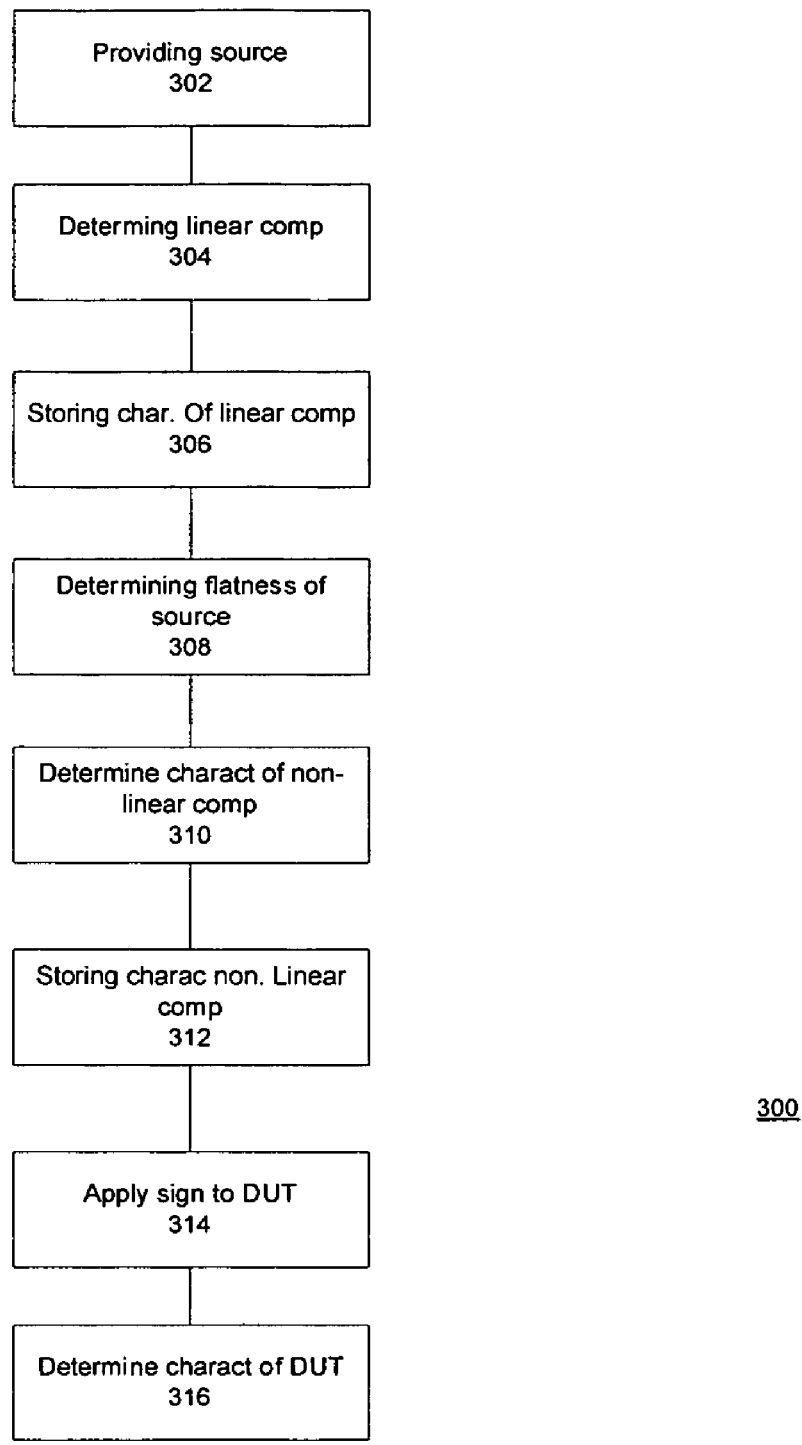
FIG. 3 is a flow chart illustrating a method of an embodiment of the invention.

FIG. 3 illustrates an embodiment of a method 300 of the present invention. The method 300, provides 302 a source module which includes a first linear component and a first non-linear component. Characteristics of the first linear component are determined 304. The determined characteristics of the first linear component are stored 306 in a database. The flatness characteristics of the source module are determined 308, and these flatness characteristics, and the characteristics of the first linear component are used to determine 310 characteristics of the first non-linear component. The determined characteristics of the non-linear component are then stored 312 in the database. A signal from the source module is applied 314 to a device under test, and a measurement signal from the device under test, is used along with data from the data base to determine 316 characteristics of the device under test.

Additionally, it should be noted that the method 300 shown in FIG. 3, as well as the method 400 of FIG. 4, described in more detail below, are applicable to a situation where multiple linear components are being characterized, and the characteristics of one linear component can be used in the determination of the characteristics of another linear component. For example, these methods could be utilized in a test system where a source module is provided, and the source module includes a first linear component, and a second linear component. The characteristics of the first component would then be determined, and the characteristics would be stored in a component database, wherein the component database includes data for a plurality of different components which can be used in the test system. The method would also include determining characteristics of the source module, and then using the characteristics of the source module, and the characteristics of the first component to determine characteristics of the second component. The determined characteristics of the second component would then be stored in the component database, and a signal from the source module would be applied to a device under test. A measurement signal from the device under test is then received, and the data from component data base, and the measurement signal are used to determine characteristics of the device under test. In some cases the first component and the second component could both be linear components, or one or both of the components could be non-linear components, where as an approximation the components can be treated as linear components. In connection with the methods and systems herein it should also be recognized that while source modules, and receiver modules are two functional system modules that are frequently found in test systems, functional system modules which provide for other functions such as different types of signal conditioning or signal processing can also be calibrated using the procedures described herein.

Figure 4:
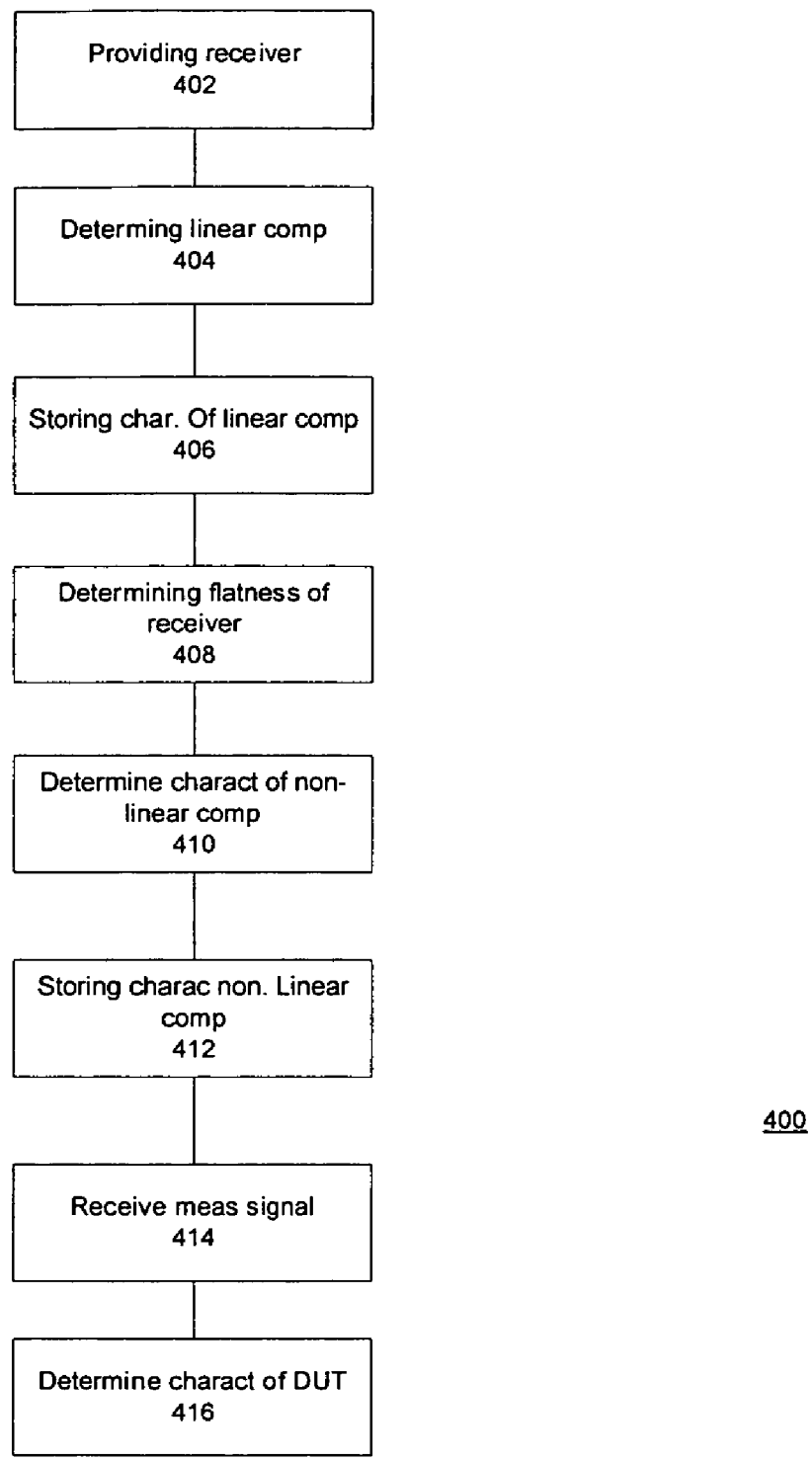
FIG. 4 is a flow chart illustrating additional elements of a method of an embodiment of the invention.

FIG. 4 illustrates an embodiment of a method 400 of the present invention, which can be provided in addition to the method 300 described above. The method 400 provides 402 a receiver module which includes a second linear component and a second non-linear component. Characteristics of the second linear component are determined 404. The determined characteristics of the second linear component are stored 406 in a database. The flatness characteristics of the receiver module are determined 408, and these flatness characteristics, and the characteristics of the second linear component are used to determine 410 characteristics of the second non-linear component. The determined characteristics of the second non-linear component are then stored 412 in the database. A measurement signal is then received 414 from a device under test, and the measurement, is used along with data from the data base to determine 416 characteristics of the device under test.

An embodiment of a method of the invention provides for measuring the characteristics of linear components which are used in the test system configuration. The different modules of the calibration service can then use common instrument driver modules to operate various components of the system to perform flatness calibrations, and IQ calibrations as discussed above. The results of these calibrations can then be stored in a component database. An error correction module can then be used with the data in the component database to further identify characteristics of different components in the test system configuration. A test procedure module can be used to drive the components of the test system to perform different measurements on a device. An I/Q module of the calibration service can be accessed by the test module to provide for predistortion calculations for a signal input to a source module of the test system configuration. The error correction module can then be used in conjunction with the test module to provide for error correction on the obtained measurement data.

Although only specific embodiments of the present invention are shown and described herein, the invention is not to be limited by these embodiments. Rather, the scope of the invention is to be defined by these descriptions taken together with the attached claims and their equivalents.

What is claimed is:

1. In a test system a method for providing for corrected measurements, the method comprising:
   providing a source module which includes a first linear component and a first non-linear component;
   determining characteristics of the first linear component;
   storing the characteristics of the first linear component in a component database, wherein the component database includes data for a plurality of different components which can be used in the test system;
   determining flatness characteristics of the source module;
   using the flatness characteristics of the source module, and the characteristics of the first linear component to determine characteristics of the first non-linear component;
   storing the determined characteristics of the non-linear component in the component database;
   applying a signal from the source module to a device under test;
   receiving a measurement signal from the device under test, and using data from the component data base, and the measurement signal to determine characteristics of the device under test; and
   providing the determined characteristics of the device under test to a user interface.

2. The method of claim 1 further comprising:
   providing a receiver module which includes a second linear component, and second non-linear component, and wherein the receiver module receives the measurement signal;
   determining characteristics of the second linear component;
   storing the characteristics of the second linear component in the component database;
   determining flatness characteristics of the receiver module;
   using the flatness characteristics of the receiver module, and the characteristics of the second linear component to determine characteristics of the second non-linear component; and
   storing the determined characteristics of the second non-linear component in the component database.

3. The method of claim 2 wherein the first non-linear component is an upconverter and the second non-linear component is a down converter.

4. The method of claim 1 wherein the characteristics of the first linear component are S-parameters.

5. The method of claim 1 further comprising:
   replacing the first linear component in the source module with a third linear component, wherein the component data base includes data corresponding to characteristics for the third linear component; and
   using the stored characteristics for the third linear component, and the stored characteristics for the first non-linear component, and the measurement signal to determine characteristics of the device under test.

6. The method of claim 5 wherein the first linear component is a cable and the third linear component is a cable.

7. The method of claim 1 wherein the first non-linear component is an upconverter.

8. The method of claim 1 wherein the first linear component is a cable.

9. The method of claim 1 further comprising:
   using an S-parameter simulator with the stored characteristics of the first linear component, and the flatness characteristics of the source module to determine the characteristics of the first non-linear component.

10. A test system for providing for corrected measurements for a device under test, the system comprising:
    a source module which includes a first linear component and a first non-linear component;
    a receiver module which includes a second linear component and second non-linear component;
    a controller system which includes a component database, and includes a processor which is programmed to receive characteristics of the first linear component and to store characteristics of the first linear component in the component database, and to determine flatness characteristics of the source module, and to use the flatness characteristics of the source module and the characteristics of the first linear component to determine characteristics of the first non-linear component, and to store the determined characteristics of the first non-linear component in the component database;
    wherein the controller system controls the source module and the receiver module such that the source module applies a signal to a device under test, and the receiver module receives a measurement signal from the device under test; and
    wherein the processor uses data from the component data base and the received measurement signal to provide error corrected measurements of the device under test to a user interface.

11. The system of claim 10 wherein the processor is programmed to receive characteristics of the second linear component, and to store characteristics of the second linear component in the component database, the processor is further programmed to determine flatness characteristics of the receiver module, and to use the flatness characteristics of the receiver module, and the characteristics of the second linear component to determine characteristics of the second non-linear component, and to store the determined characteristics of the second non-linear component in the component database.

12. The system of claim 11 wherein the first non-linear component is an upconverter and the second non-linear component is a down converter.

13. The system of claim 10 wherein the characteristics of the first linear component are S-parameters.

14. The system of claim 10 wherein the processor is programmed to determine when the first linear component of the source module is replaced with a third linear component, wherein the processor is operable obtain characteristics for the third linear component from the component database, and to use the characteristics of the third linear component, and the characteristics of the first non-linear component to provide for error corrected measurement of the device under test.

15. The system of claim 14 wherein the first linear component is a cable and the third linear component is a cable.

16. The system of claim 10 wherein the first non-linear component is an upconverter.

17. The system of claim 10 wherein the first linear component is a cable.

18. The system of claim 10 wherein the processor is further programmed to provide an S-parameter simulator and the S-parameter simulator is operable to use the stored characteristics of the first linear component and the flatness characteristics of the source module to determine the characteristics of the first non-linear component.

19. In a test system a method for providing for corrected measurements, the method comprising:
   providing a functional system module which includes a first component and a second component;
   determining characteristics of the first component;
   storing the characteristics of the first component in a component database, wherein the component database includes data for a plurality of different components which can be used in the test system;
   determining characteristics of the functional system module;
   using the characteristics of the functional system module, and the characteristics of the first component to determine characteristics of the second component;
   storing the determined characteristics of the second component in the component database;
   applying a signal to a device under test;
   receiving a measurement signal from the device under test, and using data from the component data base, and the measurement signal to determine characteristics of the device under test; and
   providing the determined characteristics of the device under test to a user interface.

20. The method of claim 19 wherein the first component and the second component are linear components.

21. The method of claim 19 wherein the first component is a linear component and the second component is a non-linear component.

22. The method of claim 19 wherein the first component is a non-linear component and the second component is a linear component.

* * * * *